United States Patent
Wu et al.

(10) Patent No.: US 12,412,873 B2
(45) Date of Patent: Sep. 9, 2025

(54) DISPLAY PANEL HAVING VERTICAL LIGHT EMITTING DEVICE AND FLIP CHIP LIGHT EMITTING DEVICE

(71) Applicant: Au Optronics Corporation, Hsinchu (TW)

(72) Inventors: Yang-En Wu, Hsinchu (TW); Shih-Hsiung Lin, Hsinchu (TW); Jenn-Jia Su, Hsinchu (TW); June Woo Lee, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 620 days.

(21) Appl. No.: 17/701,683

(22) Filed: Mar. 23, 2022

(65) Prior Publication Data

US 2023/0112531 A1    Apr. 13, 2023

(30) Foreign Application Priority Data

Oct. 12, 2021    (TW) ................. 110137797

(51) Int. Cl.
*H01L 25/075* (2006.01)
*H01L 23/00* (2006.01)
(Continued)

(52) U.S. Cl.
CPC .......... *H01L 25/0753* (2013.01); *H01L 24/13* (2013.01); *H01L 24/29* (2013.01); *H01L 24/98* (2013.01); *H10H 20/018* (2025.01); *H10H 20/857* (2025.01); *H01L 24/16* (2013.01); *H01L 24/24* (2013.01); *H01L 24/27* (2013.01); *H01L 24/32* (2013.01); *H01L 24/73* (2013.01); *H01L 24/81* (2013.01); *H01L 24/83* (2013.01); *H01L 24/92* (2013.01); *H01L 2224/13084* (2013.01); *H01L 2224/13109* (2013.01); *H01L 2224/13111* (2013.01); *H01L 2224/13113* (2013.01);
(Continued)

(58) Field of Classification Search
None
See application file for complete search history.

(56) References Cited

U.S. PATENT DOCUMENTS 9,997,501 B2    6/2018    Bower et al.
10,840,158 B2   11/2020   Guo et al.
(Continued)

FOREIGN PATENT DOCUMENTS

CN    111524928    8/2020
KR    102222355    3/2021
(Continued)

*Primary Examiner* — Julio J Maldonado
*Assistant Examiner* — Pinaki Das
(74) *Attorney, Agent, or Firm* — JCIPRNET

(57) ABSTRACT

A display panel includes a pixel array substrate, a plurality of vertical light emitting devices and a flip-chip light emitting device. The pixel array substrate has a first pixel area and a second pixel area. The vertical light emitting devices are disposed in the first pixel area and the second pixel area and electrically connected to the pixel array substrate. The flip-chip light emitting device is disposed in the second pixel area and electrically connected to the pixel array substrate. A color of an emitted light beam of the flip-chip light emitting device and a color of an emitted light beam of one of the vertical light emitting devices located in the first pixel area are identical.

14 Claims, 17 Drawing Sheets

(51) Int. Cl.
    *H10H 20/01*       (2025.01)
    *H10H 20/825*     (2025.01)
    *H10H 20/833*     (2025.01)
    *H10H 20/855*     (2025.01)
    *H10H 20/857*     (2025.01)

(52) U.S. Cl.
CPC ............... *H01L 2224/13118* (2013.01); *H01L 2224/1312* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/13166* (2013.01); *H01L 2224/13169* (2013.01); *H01L 2224/13171* (2013.01); *H01L 2224/16227* (2013.01); *H01L 2224/24051* (2013.01); *H01L 2224/24105* (2013.01); *H01L 2224/24147* (2013.01); *H01L 2224/27002* (2013.01); *H01L 2224/29084* (2013.01); *H01L 2224/29109* (2013.01); *H01L 2224/29111* (2013.01); *H01L 2224/29113* (2013.01); *H01L 2224/29118* (2013.01); *H01L 2224/2912* (2013.01); *H01L 2224/29139* (2013.01); *H01L 2224/29144* (2013.01); *H01L 2224/29147* (2013.01); *H01L 2224/29155* (2013.01); *H01L 2224/29164* (2013.01); *H01L 2224/29166* (2013.01); *H01L 2224/29169* (2013.01); *H01L 2224/29171* (2013.01); *H01L 2224/32227* (2013.01); *H01L 2224/73267* (2013.01); *H01L 2224/81805* (2013.01); *H01L 2224/83005* (2013.01); *H01L 2224/83805* (2013.01); *H01L 2224/92244* (2013.01); *H01L 2224/98* (2013.01); *H01L 2924/0132* (2013.01); *H01L 2924/0133* (2013.01); *H01L 2924/0134* (2013.01); *H01L 2924/014* (2013.01); *H01L 2924/12041* (2013.01); *H10H 20/01335* (2025.01); *H10H 20/0137* (2025.01); *H10H 20/032* (2025.01); *H10H 20/825* (2025.01); *H10H 20/833* (2025.01); *H10H 20/855* (2025.01)

(56) References Cited

U.S. PATENT DOCUMENTS

| | | | |
|---|---|---|---|
| 11,335,244 | B2 | 5/2022 | Wang et al. |
| 2012/0211793 | A1* | 8/2012 | Bergmann ............ H01L 27/153 |
| | | | 257/E33.066 |
| 2014/0367633 | A1 | 12/2014 | Bibl et al. |
| 2019/0165231 | A1* | 5/2019 | Doan ..................... H01L 33/52 |
| 2020/0152827 | A1* | 5/2020 | Chen ..................... H01L 25/13 |
| 2021/0013186 | A1* | 1/2021 | Chen .................. H01L 25/0753 |
| 2021/0343230 | A1 | 11/2021 | Wang et al. |
| 2022/0020812 | A1* | 1/2022 | Kwon ..................... H01L 33/62 |
| 2024/0063157 | A1 | 2/2024 | Chen et al. |

FOREIGN PATENT DOCUMENTS

| | | |
|---|---|---|
| TW | 201926667 | 7/2019 |
| TW | 202119669 | 5/2021 |

\* cited by examiner

DISPLAY PANEL HAVING VERTICAL LIGHT EMITTING DEVICE AND FLIP CHIP LIGHT EMITTING DEVICE

CROSS-REFERENCE TO RELATED APPLICATION

This application claims the priority benefit of Taiwan patent application no. 110137797, filed on Oct. 12, 2021. The entirety of the above-mentioned patent application is hereby incorporated by reference herein and made a part of this specification.

BACKGROUND

Technical Field

The disclosure relates to a display panel; more particularly, the disclosure relates to a display panel having light emitting devices.

Description of Related Art

In recent years, under the circumstances that manufacturing costs of an organic light emitting diode (OLED) display panel are high and its service life cannot compete with the current mainstream display, a micro light emitting diode (LED) display as an investment target has gradually attracted the attention of various technology manufacturers. The micro LED display has optical performance comparable to that of the OLED display, such as high color saturation, fast response speed m and high contrast, and has advantages of low power consumption and long material life.

In consideration of costs and display quality, a display technology using a vertical micro LED as a light emitting device has been proposed. After one side electrode of such a light emitting device is bonded to a circuit back plate, an additional photolithography and etching process (PEP) is required to form a conductive line, so that the other side electrode may be electrically connected to the circuit back plate through the conductive line. However, the above-mentioned connection relationship increases the difficulty of a repairing process.

SUMMARY

The disclosure provides a display panel having a vertical light emitting device; a reworkability of a repairing process of the display panel is favorable, and a repairing yield is relatively high.

In an embodiment of the disclosure, a display panel including a pixel array substrate, a plurality of vertical light emitting devices, and a flip-chip light emitting device is provided. The pixel array substrate has a first pixel area and a second pixel area. The vertical light emitting devices are disposed in the first pixel area and the second pixel area and electrically connected to the pixel array substrate. The flip-chip light emitting device is disposed in the second pixel area and electrically connected to the pixel array substrate. A color of an emitted light beam of the flip-chip light emitting device and a color of an emitted light beam of one of the vertical light emitting devices located in the first pixel area are identical.

In another embodiment of the disclosure, a display panel including a pixel array substrate, a vertical light emitting device, and a flip-chip light emitting device is provided. The pixel array substrate has a plurality of pixel areas and a first pad, a first repairing pad, and a second repairing pad disposed in each of the pixel areas. The first pad is electrically connected to the first repairing pad. The vertical light emitting device is electrically bonded to the first pad disposed in one of the pixel areas. The flip-chip light emitting device is electrically bonded to the first repairing pad and the second repairing pad disposed in the one of the pixel areas. A color of an emitted light beam of the flip-chip light emitting device and a color of an emitted light beam of the vertical light emitting device are identical.

In view of the above, in the display panel provided in one or more embodiments of the disclosure, the vertical light emitting devices located in the first pixel area are configured to display at least two colors, and the flip-chip light emitting device and the vertical light emitting devices located in the second pixel area are also configured to display the at least two colors. In the same pixel area, the flip-chip light emitting device is configured to replace the abnormally driven vertical light emitting device emitting the light beam with the same color as the color of the emitted light beam of the flip-chip light emitting device, so as to effectively reduce complexity of the repairing process and improve the repairing yield of the light emitting devices.

To make the above more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
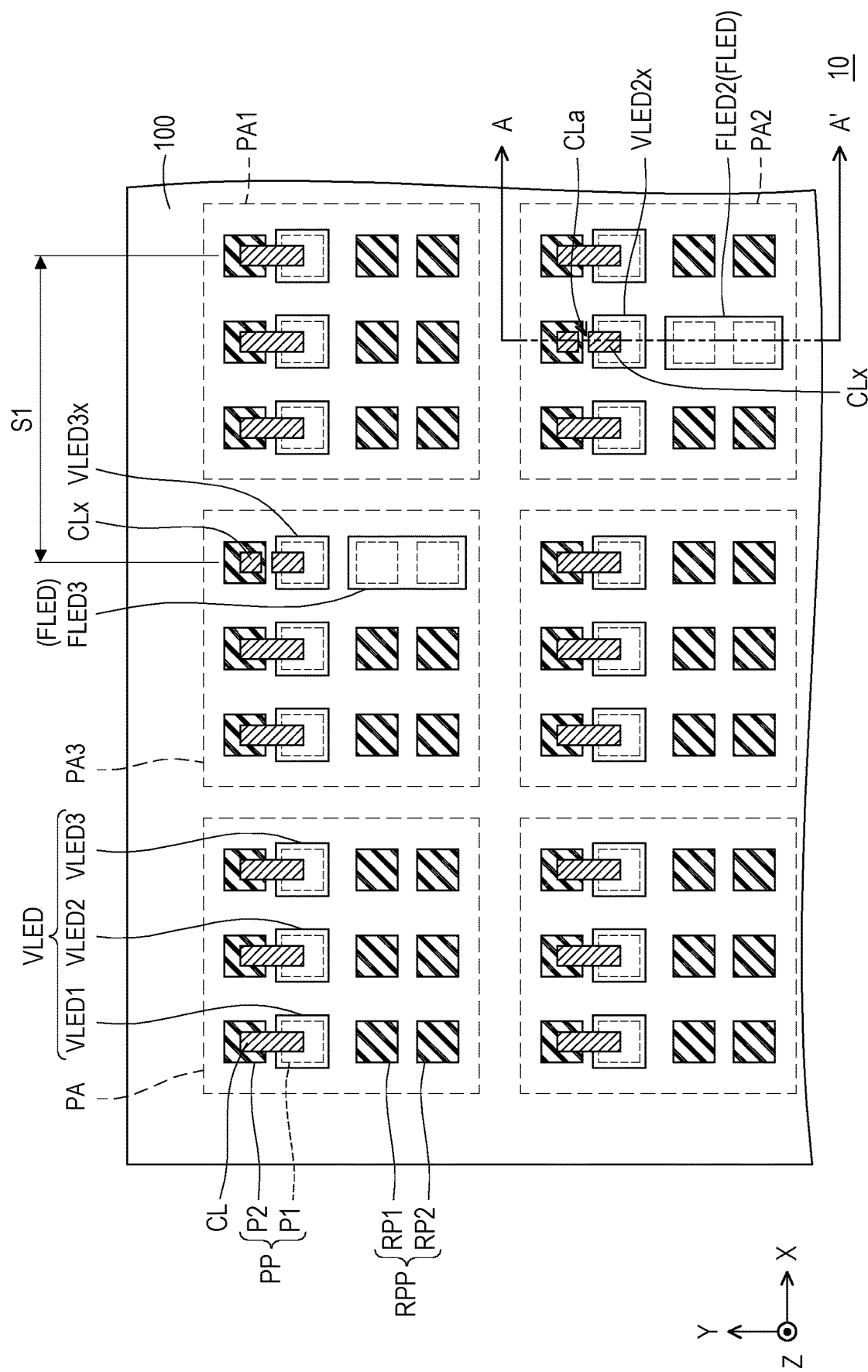
FIG. 1 is a schematic front view illustrating a display panel according to a first embodiment of the disclosure.

The term "about", "approximately", "essentially", or "substantially" as used herein is inclusive of a stated value and means within an acceptable range of deviation for the particular value as determined by people having ordinary skill in the art, considering the measurement in question and the particular quantity of errors associated with measurement (i.e., the limitations of the measurement system). For instance, "about" may refer to as being within one or more standard deviations or within ±30%, ±20%, ±15%, ±10%, or ±5% of the stated value. Furthermore, a relatively acceptable range of deviation or standard deviation may be selected for the term "about", "approximately", "essentially", or "substantially" as used herein based on measurement properties, cutting properties, or other properties, instead of applying one standard deviation across all properties.

In the accompanying drawings, thicknesses of layers, films, panels, areas, and the like are exaggerated for clarity. It should be understood that when a device, such as a layer, a film, an area, or a substrate, is referred to as being "on" or "connected to" another device, it can be directly on or connected to such another device, or intervening devices may also be present. By contrast, when a device is referred to as being "directly on" or "directly connected to" another device, there is no intervening element device. As used herein, the term "connected" may refer to "physically connected" and/or "electrically connected". Therefore, "electrical connection" between two devices may be understood as intervening devices existing between the two devices.

Reference will now be made in detail to exemplary embodiments of the disclosure, examples of which are illustrated in the accompanying drawings. Wherever possible, the same reference numerals are used in the drawings and the description to refer to the same or similar parts.

Figure 2:
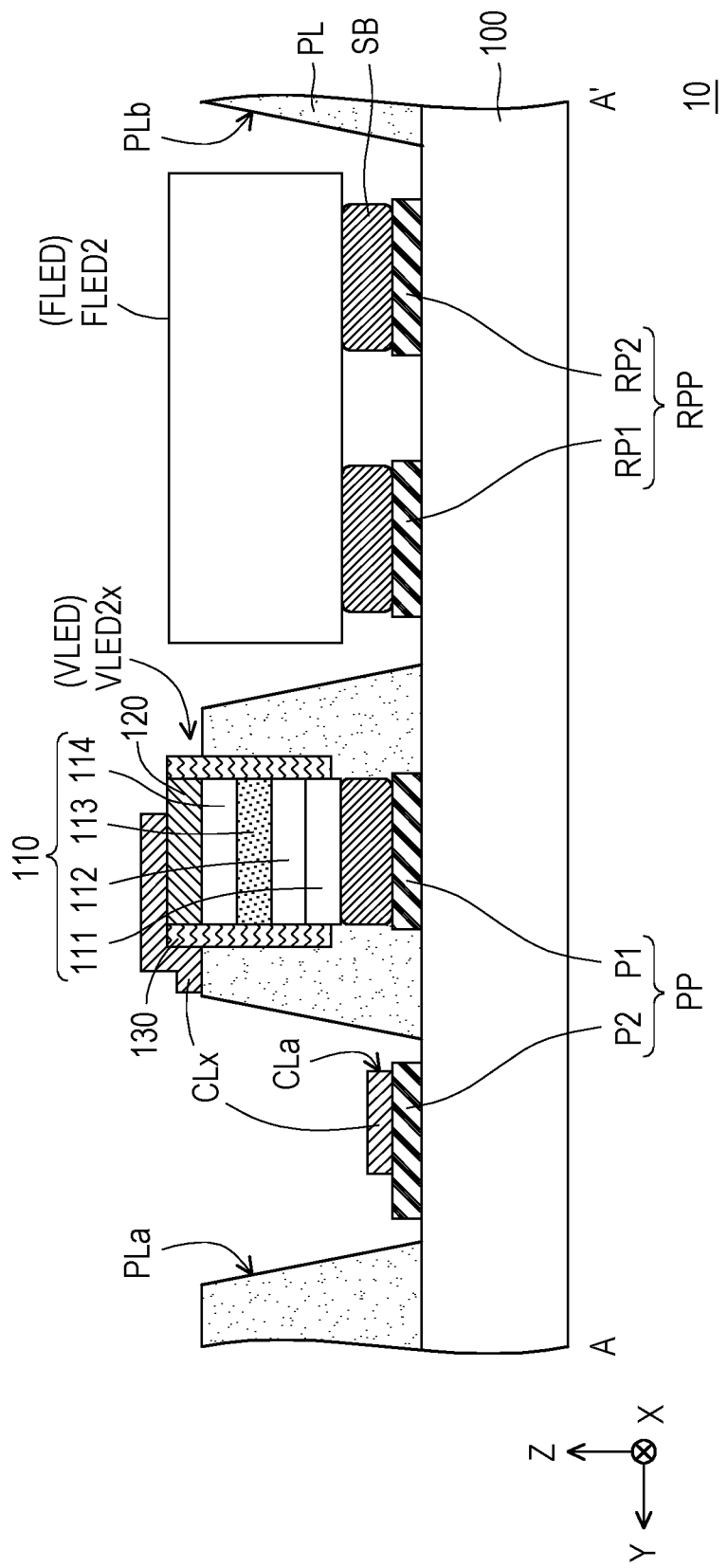
FIG. 2 is a schematic cross-sectional view illustrating the display panel depicted in FIG. 1.
Figure 3:
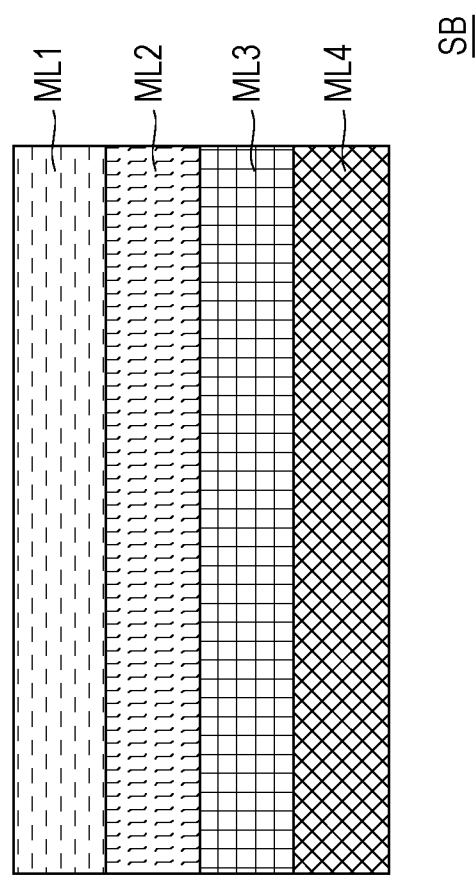
FIG. 3 is a schematic cross-sectional view illustrating the solder pattern depicted in FIG. 2.
Figure 4A:
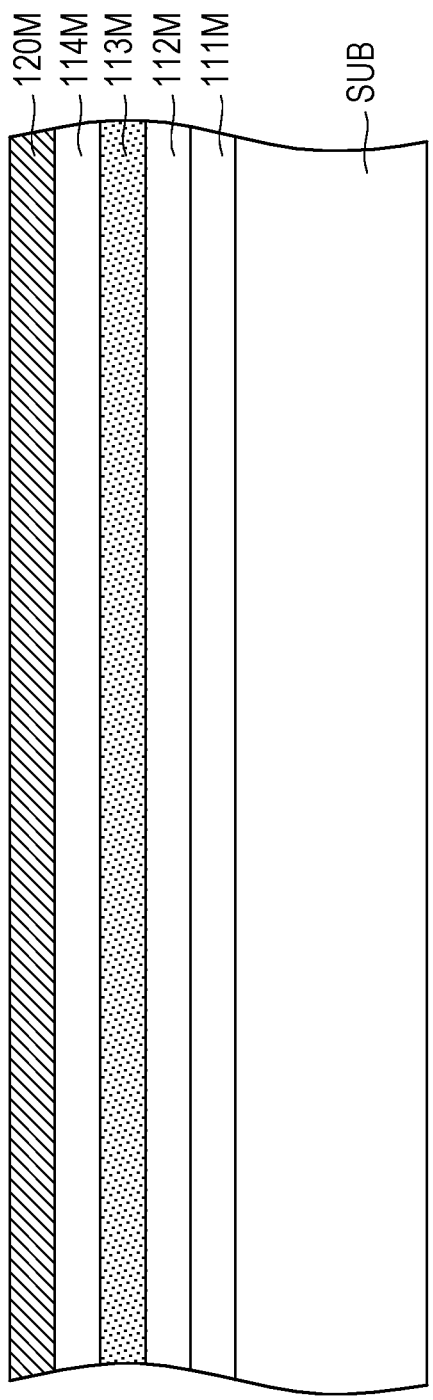
FIG. 4A to FIG. 4H are schematic cross-sectional views illustrating a manufacturing process of the display panel depicted in FIG. 1.
Figure 5A:
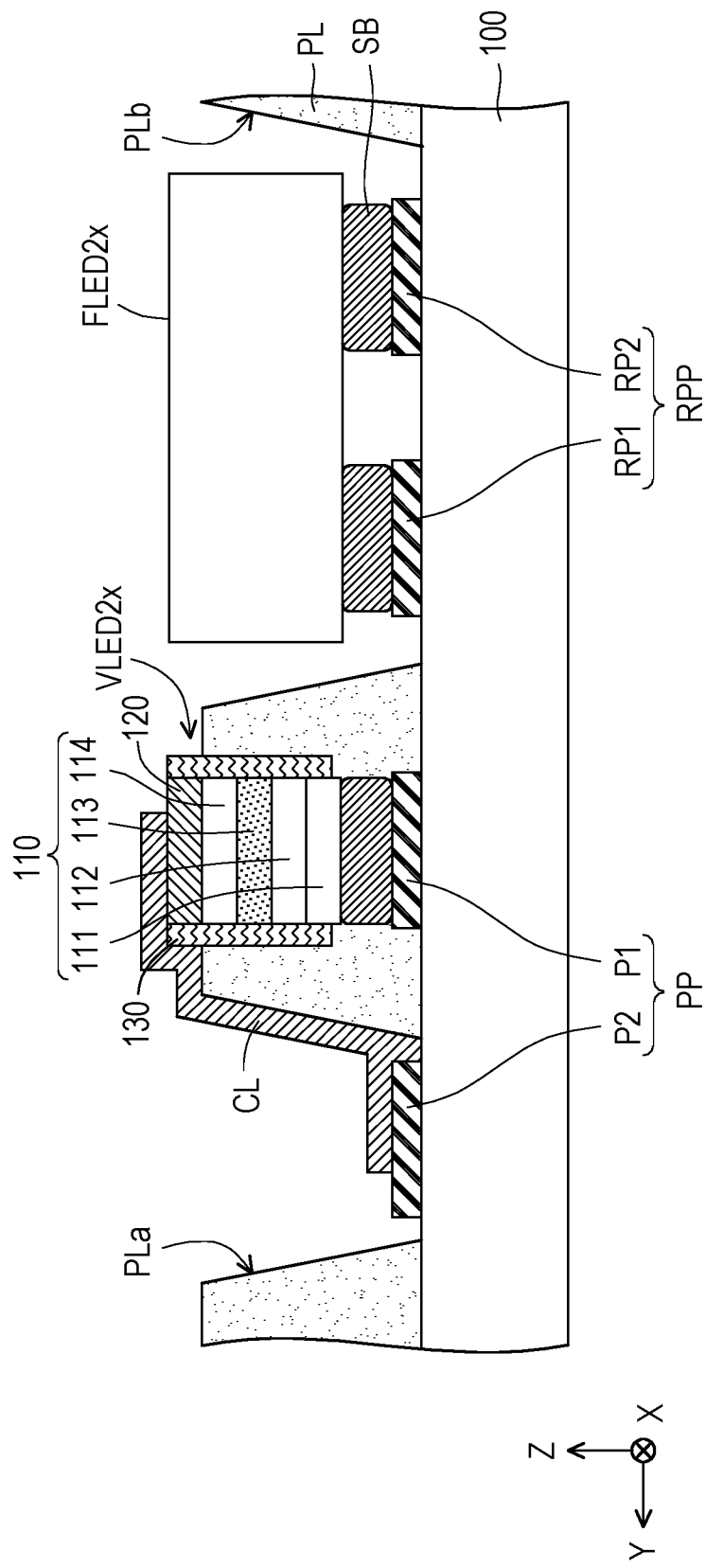
FIG. 5A and FIG. 5B are schematic cross-sectional views illustrating a repairing process of the display panel depicted in FIG. 1.
Figure 5B:
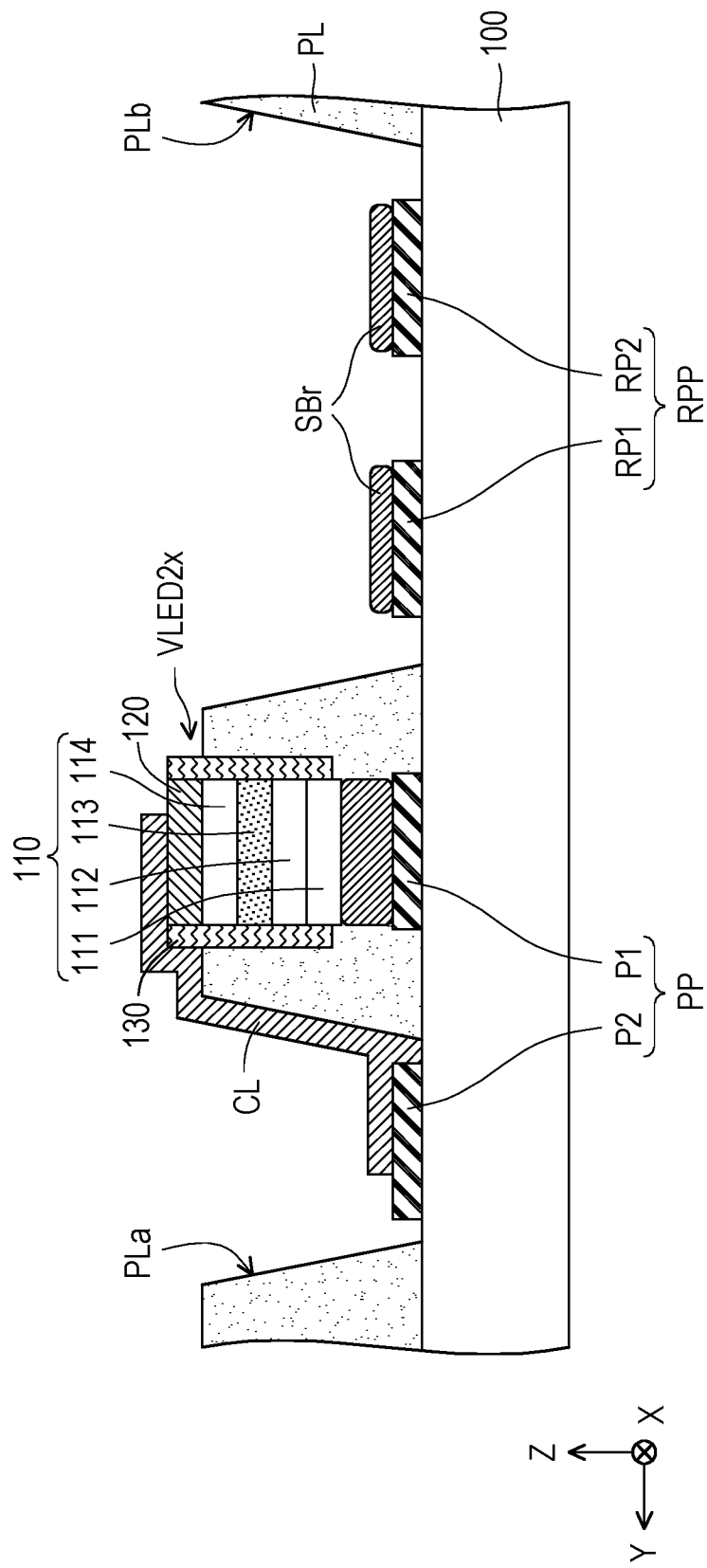
Figure 6:
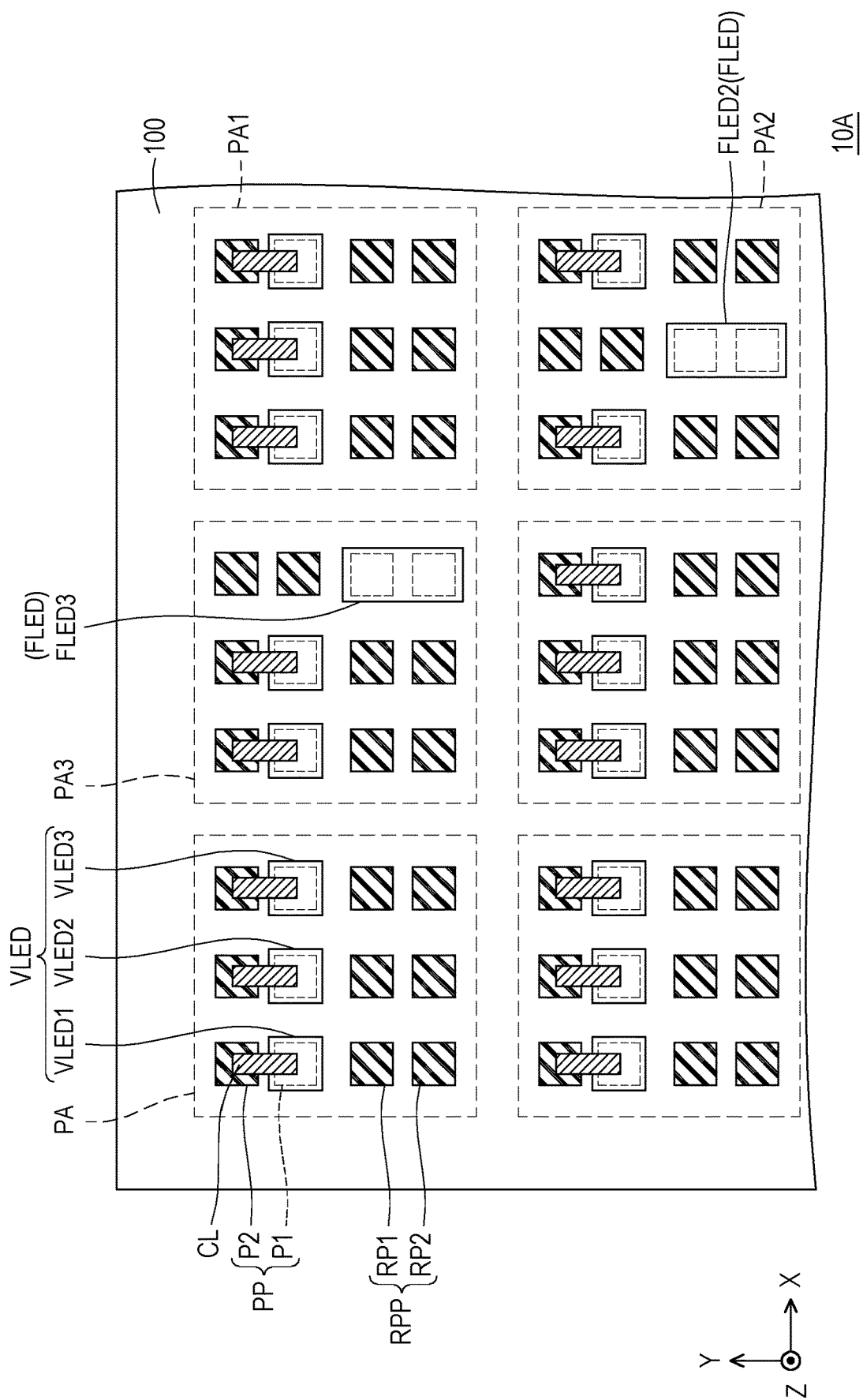
FIG. 6 is a schematic front view illustrating a display panel according to a second embodiment of the disclosure.

FIG. 1 is a schematic front view illustrating a display panel according to a first embodiment of the disclosure. FIG. 2 is a schematic cross-sectional view illustrating the display panel depicted in FIG. 1. FIG. 3 is a schematic cross-sectional view illustrating the solder pattern depicted in FIG. 2. FIG. 2 corresponds to a sectional line A-A' in FIG. 1. FIG. 4A to FIG. 4H are schematic cross-sectional views illustrating a manufacturing process of the display panel depicted in FIG. 1. FIG. 5A and FIG. 5B are schematic cross-sectional views illustrating a repairing process of the display panel depicted in FIG. 1. FIG. 6 is a schematic front view illustrating a display panel according to a second embodiment of the disclosure. For clear illustration, a planarization PL depicted in FIG. 2 is omitted from FIG. 1.

With reference to FIG. 1 and FIG. 2, a display panel 10 includes a pixel array substrate 100 and a plurality of vertical light emitting devices VLED. The pixel array substrate 100 has a plurality of pixel areas PA, and the vertical light emitting devices VLED are disposed in the pixel areas PA. In this embodiment, each of the pixel areas PA may have three vertical light emitting devices VLED, i.e., a first vertical light emitting device VLED1, a second vertical light emitting device VLED2, and a third vertical light emitting device VLED3, respectively, and colors of emitted light beams of the three vertical light emitting devices VLED are different from one other. For instance, the first vertical light emitting device VLED1, the second vertical light emitting device VLED2, and the third vertical light emitting device VLED3 are configured to emit red, green, and blue light beams, respectively, which should however not be construed as a limitation in the disclosure. In other embodiments, the preset number of the light emitting devices and the number of the colors of the emitted light beams in each pixel area PA may be adjusted according to actual optical design or application requirements.

In this embodiment, each of the pixel areas PA has three first pads P1 and three second pads P2. The first vertical light emitting device VLED1, the second vertical light emitting device VLED2, and the third vertical light emitting device VLED3 are respectively bonded to a corresponding pad set PP (i.e., the combination of the first pad P1 and the second pad P2), so as to be electrically connected to the pixel array substrate 100, which should however not be construed as a limitation in the disclosure. In other embodiments, the display panel may also share an electrode layer in replacement of the aforesaid second pads P2.

For instance, the vertical light emitting devices VLED may include an epitaxial structure layer 110, a transparent electrode layer 120, and an insulating layer 130. The epitaxial structure layer 110 has, for instance, a multi-layer stacked structure of a buffer layer 111, a first-type semiconductor layer 112, a light emitting layer 113, and a second-type semiconductor layer 114. The buffer layer 111, the first-type semiconductor layer 112, the light emitting layer 113, and the second-type semiconductor layer 114 are respectively a non-doped gallium nitride (GaN) layer, an n-type GaN layer, a multiple quantum well (MQW) layer, and a p-type GaN layer, which should however not be construed as limitations in the disclosure.

The transparent electrode layer 120 is disposed on one side of the second-type semiconductor layer 114 of the epitaxial structure layer 110 and electrically connected to the second-type semiconductor layer 114. A material of the transparent electrode layer 120 includes, for instance, indium-tin oxide (ITO), indium-zinc oxide (IZO), or other appropriate transparent metal oxides. The insulating layer 130 covers and surrounds a sidewall of the epitaxial structure layer 110 and a sidewall of the transparent electrode layer 120, which should however not be construed as a limitation in the disclosure. In other embodiments, the insulating layer may further cover a surface of the transparent electrode layer 120 facing away from the epitaxial structure layer 110.

In this embodiment, one side of the vertical light emitting device VLED where the buffer layer 111 is disposed may be electrically bonded to the pixel array substrate 100 through a solder pattern SB, and the other side of the vertical light emitting device VLED where the transparent electrode layer 120 is disposed may be electrically connected to the pixel array substrate 100 through a conductive line CL. With reference to FIG. 3, for instance, the solder pattern SB has a stacked structure of a first metal layer ML1, a second metal layer ML2, a third metal layer ML3, and a fourth metal layer ML4 sequentially disposed on the vertical light emitting device VLED. That is, the first metal layer ML1 contacts the vertical light emitting device VLED, and the fourth metal layer ML4 contacts the first pad P1. In particular, a melting point of the fourth metal layer ML4 close to the first pad P1 is lower than 260° C. That is, the fourth metal layer ML4 is made of low temperature solder. Therefore, a bonding process of the vertical light emitting devices VLED and the pixel array substrate 100 may be performed at a low process temperature.

On the other hand, the display panel 10 may further include a planarization layer PL, which covers sidewalls of the pixel array substrate 100 and each of the vertical light emitting devices VLED and exposes the second pads P2 and the transparent electrode layers 120 of the vertical light emitting devices VLED. The conductive lines CL overlap the second pads P2 and the vertical light emitting devices VLED along a direction Z. More specifically, the conductive lines CL covering the transparent electrode layers 120 extend onto the planarization layer PL and extend into an opening PLa of the planarization layer PL, so as to be electrically connected to the corresponding second pads P2.

However, the disclosure is not limited thereto. In other embodiments, the planarization layer may also be disposed on peripheries of the sidewalls of the vertical light emitting devices VLED to route the conductive lines CL. In other words, the planarization layer covers the sidewalls of the vertical light emitting devices VLED and forms island-like structures separated from one another. In addition, in some embodiments, a material of the planarization layer may be selected from a material with high reflectivity, so as to increase a light emitting efficiency of the light emitting device.

In order to increase the production yield of the display panel 10, the pixel areas PA of the display panel 10 have a plurality of repairing pad sets RPP, and the planarization layer PL also has an opening PLb that exposes the repairing pad sets RPP. In this embodiment, the number of the repairing pad sets RPP disposed in each pixel area PA is exemplified as three, for instance, and the three repairing pad sets RPP are disposed respectively corresponding to the three pad sets PP. That is to say, in each of the pixel areas PA, each of the vertical light emitting devices VLED is equipped with one repairing pad set RPP.

For instance, the pad sets PP of the pixel areas PA of the display panel 10 are arranged in a plurality of columns and rows along an x direction and a y direction, respectively. That is, the pad sets PP configured to be bonded to the vertical light emitting devices VLED are arranged in an array and disposed on the pixel array substrate 100. Correspondingly, the repairing pad sets RPP of the pixel areas PA are arranged in a plurality of columns and rows along the x direction and the y direction, respectively, and the repairing pad sets RPP and the pad sets PP are alternately arranged along the y direction. In other words, one repairing pad set RPP is reserved on one side of each vertical light emitting device VLED along the y direction.

However, the disclosure is not limited thereto. In other embodiments, the number of the pad sets PP disposed in each pixel area PA may also be different from the number of the repairing pad sets RPP. That is, the number of the vertical light emitting devices VLED and the number of the repairing pad sets RPP in each pixel area PA may be determined to be in a many-to-one or one-to-many manner. On the other hand, the arrangement of the repairing pad set RPP and the pad set PP in each pixel area PA may also be adjusted according to the actual product design, and the disclosure is not limited to what is illustrated in the drawings.

Note that the type of the light emitting device configured for repairment according to this embodiment is different from the type of the main light emitting device (i.e., the vertical light emitting devices VLED). The repairing pad sets RPP of the display panel 10 are suitable for being bonded to the flip-chip light emitting device FLED. Specifically, the repairing pad set RPP is a combination of a first repairing pad RP1 and a second repairing pad RP2. The first repairing pad RP1 and the second repairing pad RP2 are respectively electrically connected to the first pad P1 and the second pad P2 of the vertical light emitting device VLED to be repaired.

In this embodiment, abnormal vertical light emitting devices VLED in some of the pixel areas PA of the display panel 10 are found through inspection. For instance, different from the normal pixel area PA1, the pixel area PA2 and the pixel area PA3 are detected as having an abnormally driven vertical light emitting device VLED2$x$ and an abnormally driven vertical light emitting device VLED3$x$, respectively. Therefore, the repairing pad sets RPP corresponding to the abnormal vertical light emitting devices are all bonded to the flip-chip light emitting device FLED for repairment, e.g., bonded to a flip-chip light emitting device FLED2 and a flip-chip light emitting device FLED3 in the pixel area PA2 and the pixel area PA3 for repairment, respectively. Here, a color of an emitted light beam of the flip-chip light emitting device FLED2 is the same as a color of an emitted light beam of the abnormal vertical light emitting device VLED2$x$, and a color of an emitted light beam of the flip-chip light emitting device FLED3 is the same as a color of an emitted light beam of the abnormal vertical light emitting device VLED3$x$.

In particular, in the same pixel area, when the flip-chip light emitting device is configured to replace the abnormally driven vertical light emitting device emitting the light beam with the same color as the color of the emitted light beam of the flip-chip light emitting device, complexity of the repairing process may be effectively reduced, and repairing yield of the light emitting devices may be enhanced.

A manufacturing method of the display panel 10 will be exemplarily described below. With reference to FIG. 4A, steps of forming the vertical light emitting device VLED include sequentially forming a buffer material layer 111M, a first-type semiconductor material layer 112M, a light emitting material layer 113M, a second-type semiconductor material layer 114M, and a transparent electrode material layer 120M on a growth substrate SUB. The growth substrate SUB is, for instance, a gallium arsenide (GaAs) substrate, a gallium phosphide (GaP) substrate, an indium phosphide (InP) substrate, a sapphire substrate, a silicon carbide (SiC) substrate, a GaN substrate, or any other growth substrate adapted to an epitaxial process. In this embodiment, the buffer material layer 111M is, for instance, a non-doped GaN and is configured to improve the yield of the subsequent epitaxial process, which should however not be construed as a limitation in the disclosure. In other embodiments, the material of the buffer material layer 111M may also be indium gallium nitride (InGaN), GaAs, aluminum gallium indium phosphide (AlGaInP), another material composed of group IIIA and group VA elements, or any other appropriate material.

Materials of the first-type material layer 112M and the second-type semiconductor material layer 114M include, for instance, GaN, InGaN, GaAs, AlGaInP, other materials composed of group IIIA and group VA elements, or other appropriate materials. In this embodiment, the first-type semiconductor material layer 112M is, for instance, an n-type semiconductor layer, and the second-type semiconductor material layer 114M is, for instance, a p-type semiconductor layer, which should however not be construed as limitations in the disclosure. The light emitting material layer 113M is, for instance, a single quantum well (SQW) layer or a multiple quantum well (MQW). For instance, electron holes provided by the second-type semiconductor material layer 114M and electrons provided by the first-type semiconductor material layer 112M may be combined in the light emitting material layer 113M to release energy in the form of light. A material of the transparent electrode material layer 120M include, for instance, ITO, IZO, aluminum tin oxide (ATO), aluminum zinc oxide (AZO), any other appropriate metal oxide, super thin metal, carbon nanotubes, graphene, or a stacked layer of at least two of the aforesaid materials.

Figure 4B:
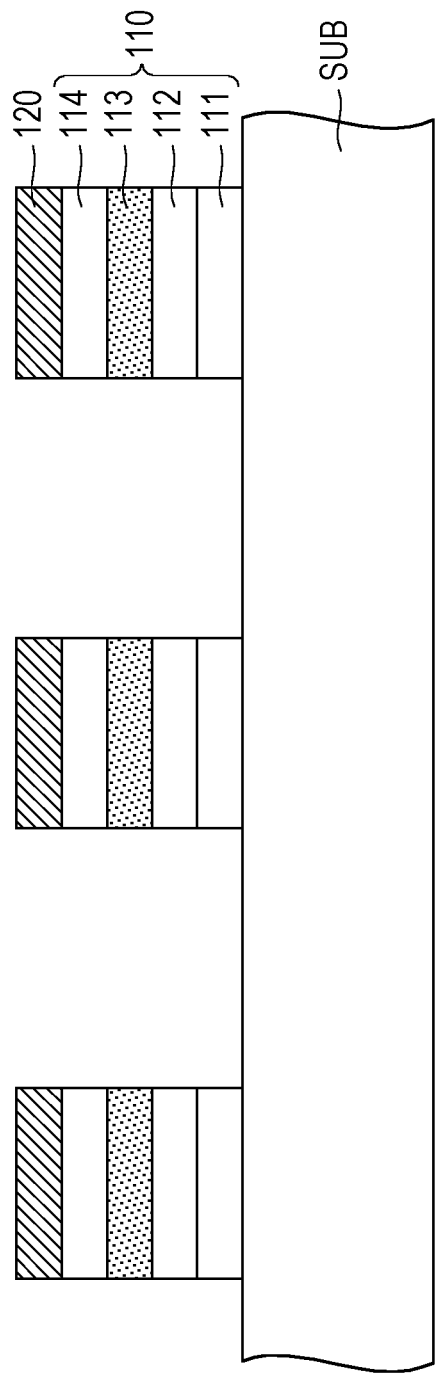
Figure 4C:
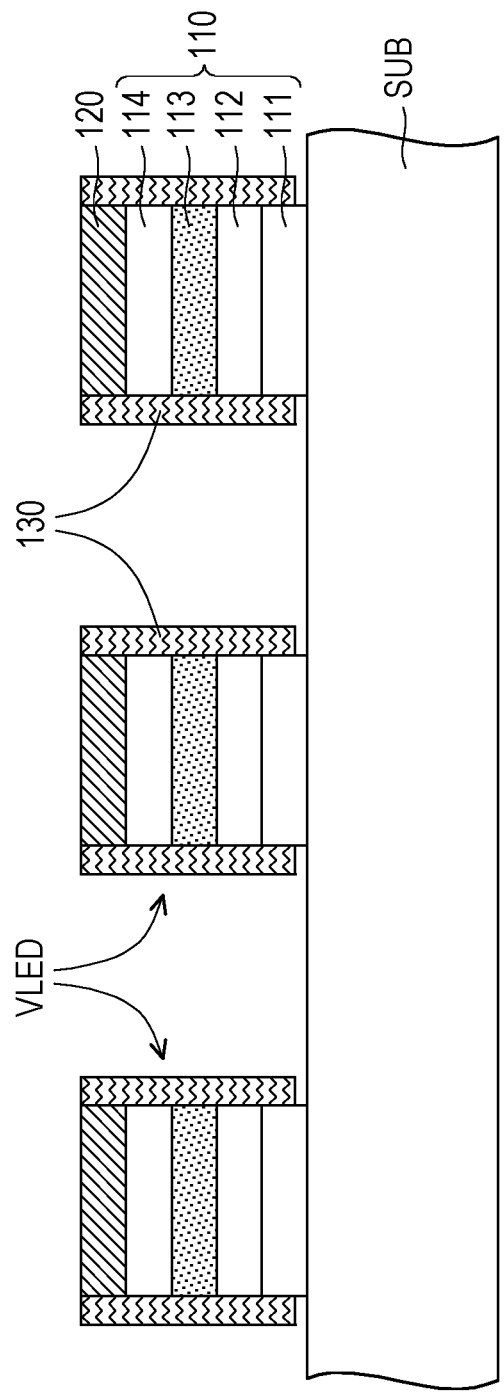

With reference to FIG. 4B, a patterning process is performed on the epitaxial material layer and the transparent electrode material layer 120M to form a plurality of epitaxial structure layers 110 and a plurality of transparent electrode layers 120; here, the epitaxial structure layers 110 have a multi-layer stacked structure of the buffer layer 111, the first-type semiconductor layer 112, the light emitting layer 113, and the second-type semiconductor layer 114. The patterning process is, for instance, a PEP process, which should however not be construed as a limitation in the disclosure. In this embodiment, steps of forming the vertical light emitting device VLED further include forming the insulating layer 130 on the sidewall of the epitaxial structure layers 110 and the transparent electrode layers 120, as shown in FIG. 4C. A material of the insulating layer 130 may include oxides (e.g., silicon oxides, silicon dioxides), nitrides (e.g., silicon nitrides), silicon oxynitrides, or a polymer material. So far, the vertical light emitting device VLED is completely formed.

Figure 4D:
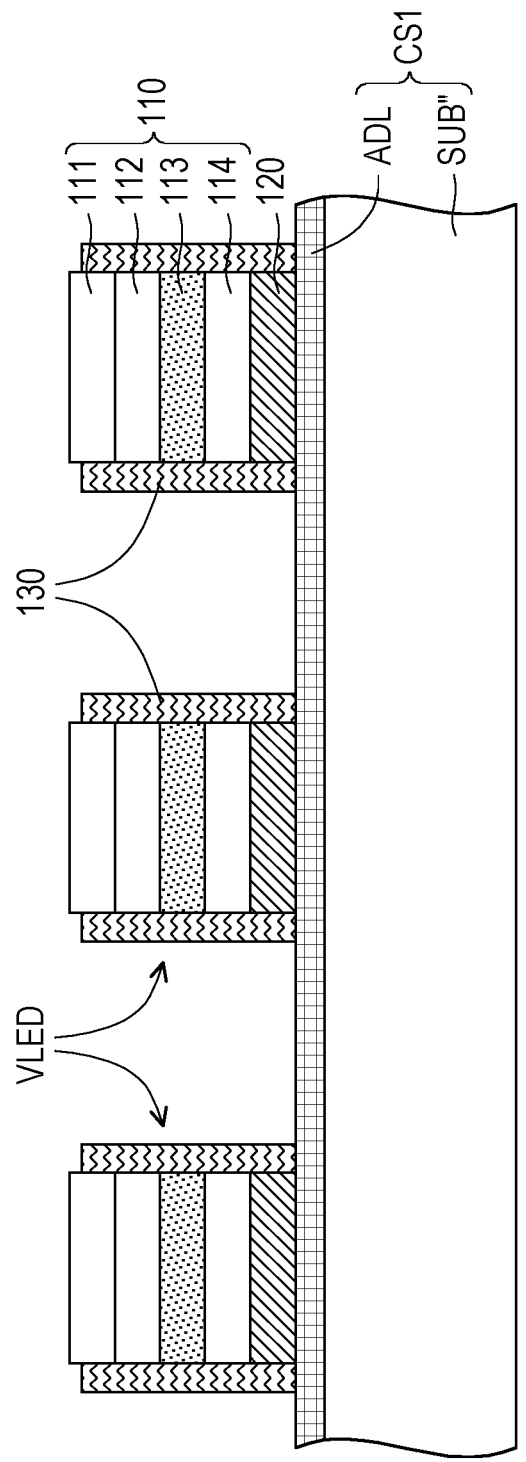

After the steps of forming the vertical light emitting device VLED are completed, a plurality of the vertical light emitting devices VLED are transferred to a carrier structure CS1, and the growth substrate SUB is removed, as shown in FIG. 4D. In this embodiment, the carrier structure CS1 includes a substrate SUB" and an adhesion layer ADL disposed on the substrate SUB", and the vertical light emitting devices VLED may be adhered onto the substrate SUB" through the adhesion layer ADL.

Figure 4E:
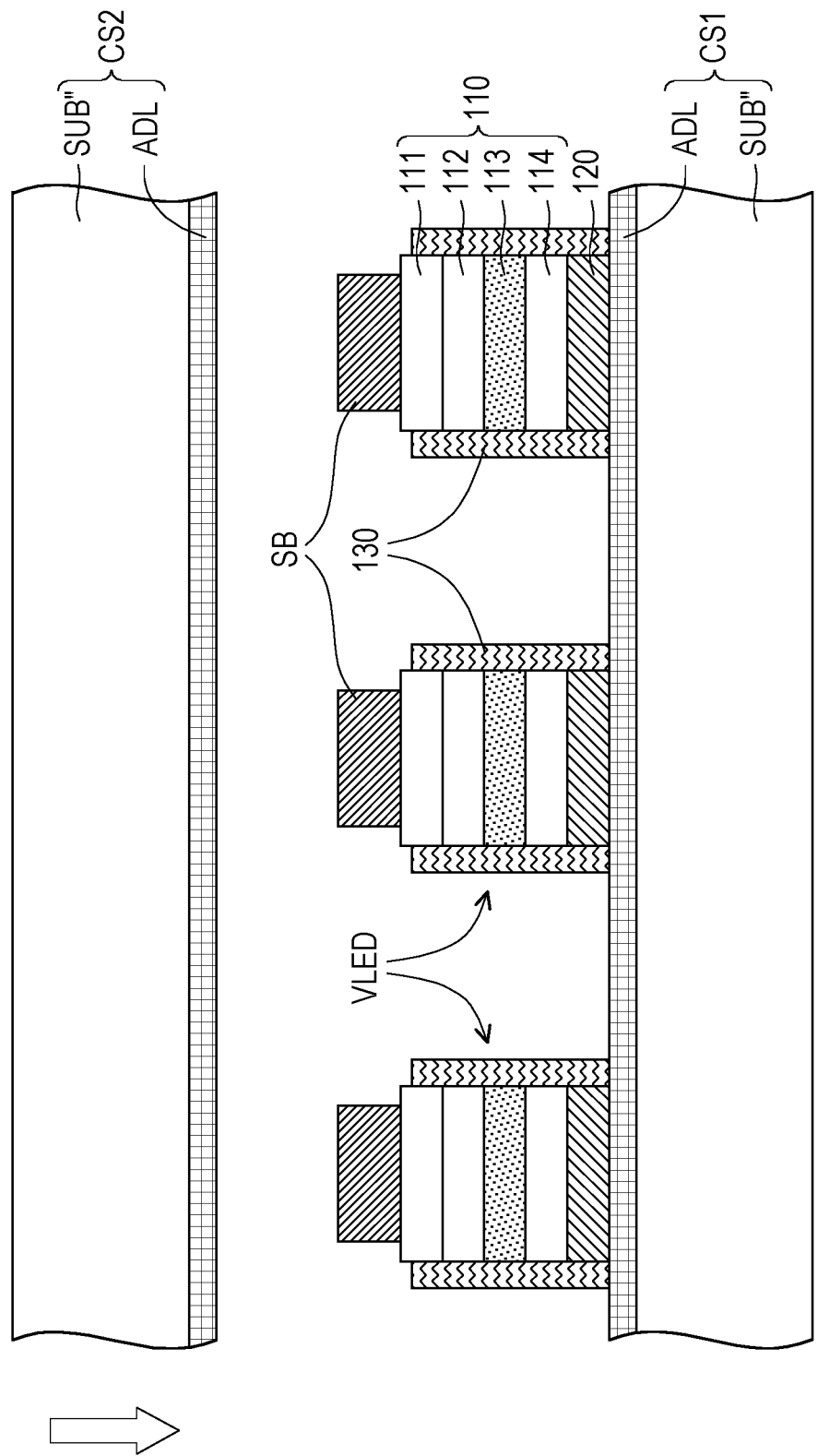

Next, the solder pattern SB is formed on each vertical light emitting device VLED, as shown in FIG. 3 and FIG. 4E. In this embodiment, steps of forming the solder pattern SB may include sequentially forming the first metal layer ML1, the second metal layer ML2, the third metal layer ML3, and the fourth metal layer ML4 on the buffer layer 111 of the vertical light emitting device VLED. A material of the first metal layer ML1 includes, for instance, titanium, chromium, platinum, a combination thereof, or any other material that is capable of effectively adhering the epitaxial structure layers 110.

When the fourth metal layer ML4 is heated to be eutectically bonded to other devices, the second metal layer ML2 may block metal elements in the fourth metal layer ML4 from being diffused to the first metal layer ML1. That is, the second metal layer ML2 may serve as a barrier. Thereby, the poor adhesion of the fourth metal layer ML4 and the first metal layer ML1 and the resultant incapability of reacting to generate an intermetallic compound, which results in cracks between the fourth metal layer ML4 and the first metal layer ML1, may be prevented. Thereby, the bonding relationship between the vertical light emitting device VLED and other devices may be ensured. A material of the second metal layer ML2 includes, for instance, nickel, copper, palladium, or a combination thereof.

Wettability of the third metal layer ML3 located between the second metal layer ML2 and the fourth metal layer ML4 to the fourth metal layer ML4 is greater than wettability of the second metal layer ML2 to the fourth metal layer ML4. In other words, it is relatively easy to planarize the fourth metal layer ML4 onto a surface of the third metal layer ML3. A material of the third metal layer ML3 includes, for instance, gold, silver, copper, palladium, nickel, or a combination thereof. A material of the fourth metal layer ML4 includes, for instance, tin, indium, bismuth, tin-bismuth alloy, tin-indium alloy, tin-copper alloy, tin-silver alloy, tin-antimony alloy, tin-zinc alloy, tin-silver-copper alloy, tin-silver-copper-bismuth alloy, or a combination thereof. Note that the melting point of the fourth metal layer ML4 is lower than 260° C.

Figure 4F:
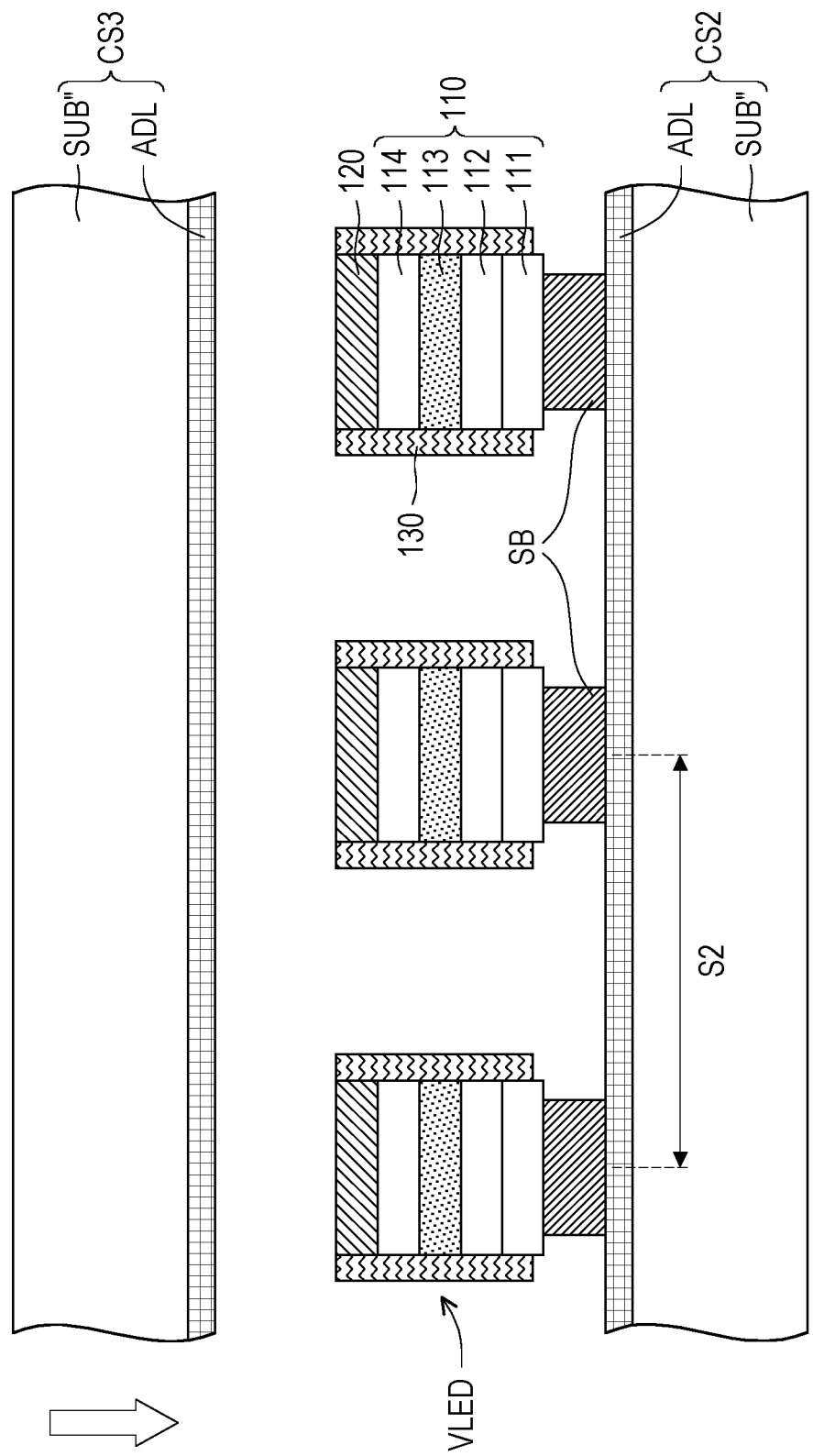
Figure 4G:
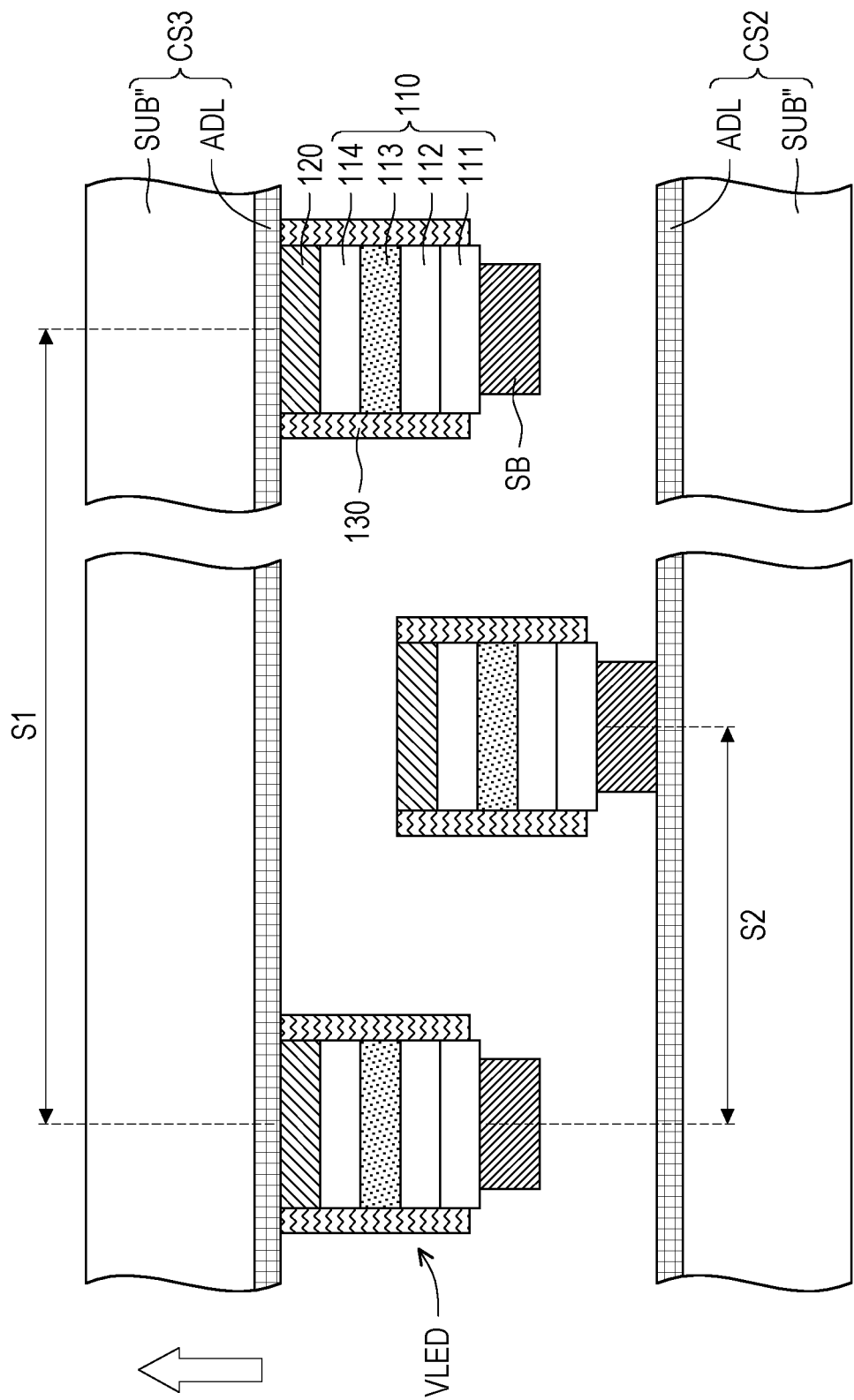
Figure 4H:
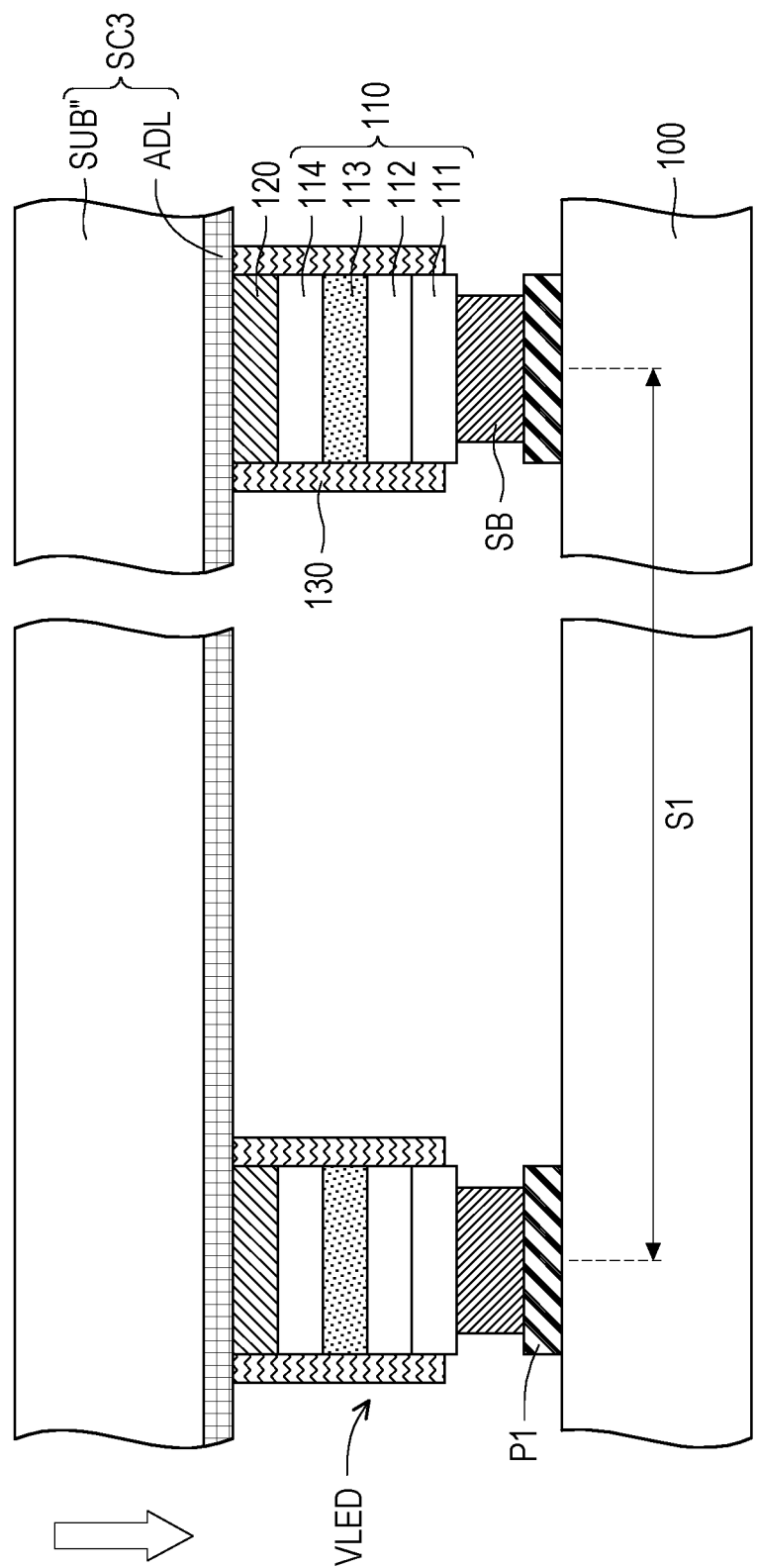

After the steps of forming the solder pattern SB are completed, a transfer process of the vertical light emitting devices VLED is performed. In this embodiment, steps of transferring the vertical light emitting device VLED may include retrieving a plurality of the vertical light emitting devices VLED on the carrier structure CS1 by applying another carrier structure CS2, as shown in FIG. 4E and FIG. 4F. Therefore, the vertical light emitting devices VLED are transferred to the carrier structure CS2 in an upside-down manner. Next, another carrier structure CS3 is applied to selectively retrieve some of the vertical light emitting devices VLED, as shown in FIG. 4F and FIG. 4G. For instance, in this embodiment, the vertical light emitting devices VLED are finally transferred and bonded to the first pads P1 of the pixel array substrate 100, and the first pads P1 configured to be bonded to the vertical light emitting devices VLED whose emitted light beams have the same color on the pixel array substrate 100 are arranged along the x direction according to a spacing S1, as shown in FIG. 4H.

Since a spacing S2 among the vertical light emitting devices VLED arranged on the carrier structure CS2 (or the growth substrate SUB) is different from the spacing S1 on the target substrate (i.e., the pixel array substrate 100), an additional transfer step is required to selectively retrieve the vertical light emitting devices VLED arranged in a manner complying with the spacing S1. However, the disclosure is not limited thereto. In other embodiments, according to different target substrate designs, the vertical light emitting devices VLED may also be directly transferred from the carrier structure CS1 and bonded to the target substrate without performing any additional transfer step.

After the steps of transferring and bonding the vertical light emitting devices VLED are completed, an electrical inspection is performed to learn whether each of the vertical light emitting devices VLED bonded to the pixel array substrate 100 operates in a normal manner. When some of the vertical light emitting devices VLED cannot be driven as usual to emit light beams, these vertical light emitting devices VLED are determined as abnormal light emitting devices, e.g., the vertical light emitting device VLED2$x$ located in the pixel area PA2 and the vertical light emitting device VLED3$x$ located in the pixel area PA3 as shown in FIG. 1. At this time, these abnormally driven light emitting devices may be repaired.

With reference to FIG. 1 and FIG. 2, for instance, when the second vertical light emitting device VLED2$x$ disposed in the pixel area PA2 is determined to be abnormal, the flip-chip light emitting device FLED2 whose emitted light beam has the same color as the color of the emitted light beam of the second vertical light emitting device VLED2$x$ may be bonded to the repairing pad set RPP close to the abnormal second vertical light emitting device VLED2$x$. In this embodiment, the abnormal second vertical light emitting device VLED2$x$ and the abnormal third vertical light emitting device VLED3$x$ still stay on the pixel array substrate 100 after the repairing process is completed. In order to ensure that electrical properties of the flip-chip light emitting device FLED for repairment are not affected by the abnormal vertical light emitting device, steps of the repairing process may further include performing a disconnection step to break the electrical connection relationship between the abnormal vertical light emitting device and the corresponding second pad P2. The disconnection step here includes, for instance, performing a laser cutting process on the conductive line CL to form a conductive line CL$x$ with a disconnected part CLa.

In this embodiment, the first repairing pad RP1 and the second repairing pad RP2 may be electrically connected to the first pad P1 and the second pad P2, respectively. For instance, the second pad P2 and the second repairing pad RP2 may be electrically connected to an active device (not shown) at the same time, and the active device is configured to control a driving current flowing through the vertical light emitting device VLED (or the flip-chip light emitting device FLED). Therefore, the disconnection step may further include performing a laser cutting process on a connection conductive wire of the abnormal vertical light emitting device and the active device (or the flip-chip light emitting device FLED for repairment). That is, the manner of disconnection provided in this disclosure is not limited to what is depicted in the drawings. Thus, the fabrication of the display panel 10 of this embodiment is completed.

Further, after the flip-chip light emitting device FLED for repairment is bonded to the corresponding repairing pad set RPP, if said flip-chip light emitting device FLED still cannot function normally and is determined as an abnormal flip-chip light emitting device (e.g., the flip-chip light emitting device FLED2x shown in FIG. 5A), the abnormal flip-chip light emitting device may be removed (as shown in FIG. 5B) to release the repairing pad set RPP for performing another bonding process of the flip-chip light emitting device FLED for repairment.

Since the flip-chip light emitting device FLED for repairment is also electrically bonded to the repairing pad set RPP through the solder pattern SB, better reworkability may be ensured. Compared to a normal bonding method which adopts an anisotropic conductive film (ACF), a part SBr of the solder pattern SB remaining on the repairing pad set RPP is easier to be removed. Therefore, the difficulty of the repairing process may be greatly reduced, and the repairing yield may be improved.

With reference to FIG. 6, in another embodiment, the repairing process of a display panel 10A may optionally include a step of removing the abnormal vertical light emitting devices. That is to say, the display panel 10A does not keep the abnormal vertical light emitting devices (e.g., the second vertical light emitting device VLED2x and the third vertical light emitting device VLED3x in FIG. 1). Therefore, the aforesaid disconnection step may be omitted from the repairing process of the display panel 10A.

Hereinafter, other embodiments will be provided to describe the disclosure in detail, wherein the same components will be marked by the same reference numbers, and the description of the same technical contents will be omitted.

Figure 7:
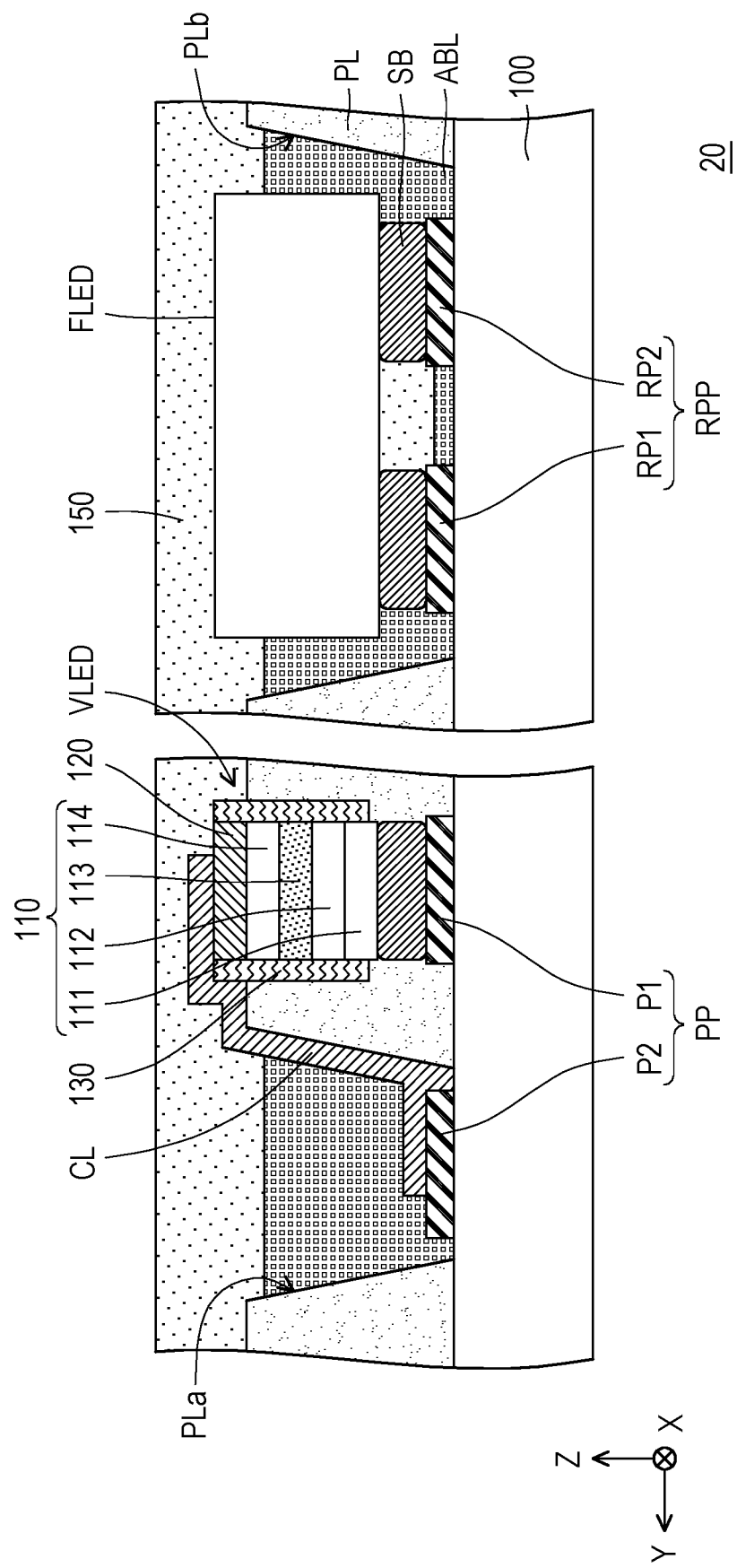
FIG. 7 is a schematic cross-sectional view illustrating a display panel according to a third embodiment of the disclosure.

FIG. 7 is a schematic cross-sectional view illustrating a display panel according to a third embodiment of the disclosure. With reference to FIG. 7, the difference between a display panel 20 provided in this embodiment and the display panel 10 depicted in FIG. 2 lies in that the display panel 20 may optionally include a light absorbing layer ABL and an optical film layer 150. The light absorbing layer ABL covers a surface of the pixel array substrate 100. The arrangement of the light absorbing layer ABL may effectively reduce an overall reflectivity of external ambient light of the display panel 20 and improve the display quality (e.g., dark state contrast). A material of the light absorbing layer ABL includes, for instance, a black resin material.

Note that a location of the light absorbing layer ABL is not limited to what is depicted in the drawings, as long as the location of the light absorbing layer ABL relative to the pixel array substrate 100 is lower than locations of the vertical light emitting device VLED and the flip-chip light emitting device FLED relative to the pixel array substrate 100.

On the other hand, in order to increase a light emitting efficiency of the light emitting device, the vertical light emitting device VLED and the flip-chip light emitting device FLED are also covered by the optical film layer 150. In this embodiment, the optical film layer 150 is, for instance, a refractive index matching layer, and a material thereof may include silicone rubber, acrylic, and so on.

Figure 8:
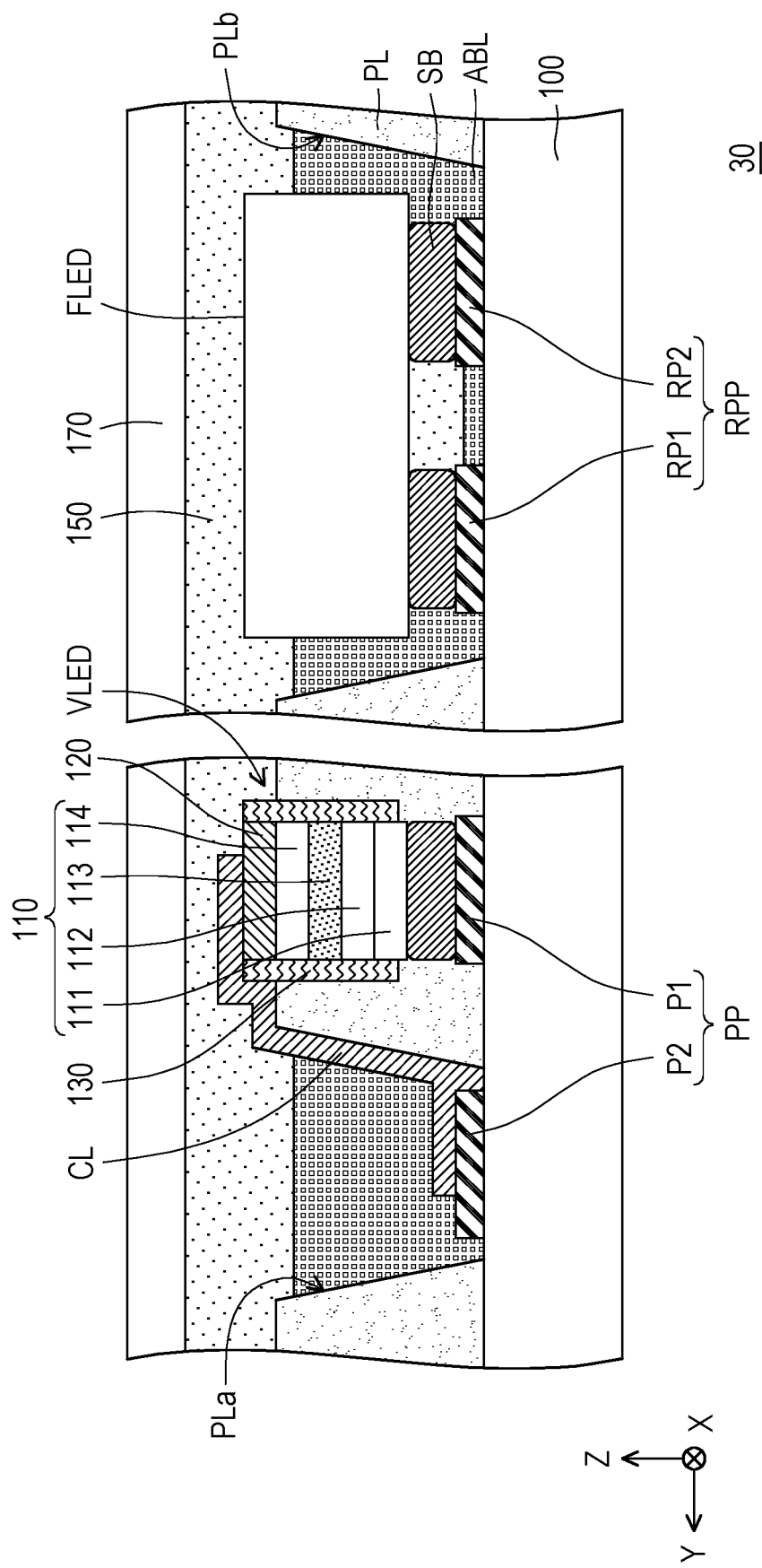
FIG. 8 is a schematic cross-sectional view illustrating a display panel according to a fourth embodiment of the disclosure.

FIG. 8 is a schematic cross-sectional view illustrating a display panel according to a fourth embodiment of the disclosure. With reference to FIG. 8, the difference between a display panel 30 provided in this embodiment and the display panel 20 depicted in FIG. 7 lies in that the display panel 30 may further include another optical film layer 170 disposed on the optical film layer 150. In this embodiment, the optical film layer 170 is, for instance, an anti-reflection layer, an anti-glare layer, an anti-fouling layer, or a stacked structure of said film layers. Thereby, the overall reflectivity of the external ambient light of the display panel 30 is reduced, which is conducive to the improvement of the display quality (e.g., the dark state contrast).

Figure 9:
FIG. 9 is a schematic front view illustrating a display panel according to a fifth embodiment of the disclosure.

FIG. 9 is a schematic front view illustrating a display panel according to a fifth embodiment of the disclosure. With reference to FIG. 9, the difference between a display panel 40 provided in this embodiment and the display panel 10 depicted in FIG. 1 lies in that the third vertical light emitting devices VLED3 of display panel 10 are replaced with a plurality of flip-chip light emitting devices FLED1 in this embodiment.

In this embodiment, one of the pad sets PP in each pixel area PA is configured for electrical bonding of one of the flip-chip light emitting devices FLED1. For example, the first pad P1 whereto the flip-chip light emitting device FLED1 is electrically bonded is electrically connected to one of the repairing pad sets RPP. That means, the repairing pad sets RPP are configured to replace not only the abnormal viatical light emitting devices VLED but also the abnormal flip-chip light emitting devices FLED1.

For example, the flip-chip light emitting device FLED3 is electrically bonded to one repairing pad set RPP to replace the abnormal flip-chip light emitting device FLED1x in the pixel area PA3, and the flip-chip light emitting device FLED2 is electrically bonded to another repairing pad set RPP to replace the abnormal vertical light emitting device VLED2x in the pixel area PA2. Here, a color of an emitted light beam of the flip-chip light emitting device FLED2 is the same as a color of an emitted light beam of the abnormal vertical light emitting device VLED2x, and a color of an emitted light beam of the flip-chip light emitting device FLED3 is the same as a color of an emitted light beam of the abnormal flip-chip light emitting device FLED1x.

In this embodiment, the first vertical light emitting device VLED1, the second vertical light emitting device VLED2, and the flip-chip light emitting device FLED1 are configured to emit red, green, and blue light beams. In some embodiments, the color of the light beams emitted from the flip-chip light emitting device FLED1 is preferably red, but the disclosure is not limited thereto.

To sum up, in the display panel provided in one or more embodiments of the disclosure, the vertical light emitting devices located in the first pixel area are configured to display at least two colors, and the flip-chip light emitting device and the vertical light emitting devices located in the second pixel area are also configured to display the at least two colors. In the same pixel area, the flip-chip light emitting device is configured to replace the abnormally driven vertical light emitting device emitting the light beam with the same color as the color of the emitted light beam of the flip-chip light emitting device, so as to effectively reduce complexity of the repairing process and improve the repairing yield of the light emitting devices.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. A display panel, comprising:
a pixel array substrate, having a first pixel area and a second pixel area, wherein each of the first pixel area and the second pixel area has a plurality of first pads, a plurality of second pads, a plurality of first repairing pads and a plurality of second repairing pads, wherein the plurality of first repairing pads are electrically and respectively connected to the plurality of first pads through the pixel array substrate, and the plurality of second repairing pads are electrically and respectively connected to the plurality of second pads through the pixel array substrate;
a plurality of vertical light emitting devices, disposed in the first pixel area and the second pixel area and electrically connected to the pixel array substrate;
a flip-chip light emitting device, disposed in the second pixel area and electrically connected to the pixel array substrate, wherein a color of an emitted light beam of the flip-chip light emitting device and a color of an emitted light beam of one of the vertical light emitting devices located in the second pixel area are identical, wherein the plurality of vertical light emitting devices are electrically bonded to the plurality of first pads, the flip-chip light emitting device is electrically bonded to one of the plurality of first repairing pads and one of the plurality of second repairing pads, each of the plurality of vertical light emitting devices is electrically connected to one of the plurality of second pads through a conductive line, and the conductive line between the one of the vertical light emitting devices and one of the plurality of second pads has a disconnected part; and
a planarization layer, covering the pixel array substrate and a sidewall of each of the vertical light emitting devices and exposing the plurality of second pads, the plurality of first repairing pads and the plurality of second repairing pads, wherein the conductive line extends onto the planarization layer, so as to be electrically connected to one of the plurality of second pads and one of the plurality of vertical light emitting devices.

2. The display panel according to claim 1, wherein the vertical light emitting devices comprise a first vertical light emitting device and a second vertical light emitting device located in the second pixel area, respective colors of emitted light beams of the first vertical light emitting device and the second vertical light emitting device are different from the color of the emitted light beam of the flip-chip light emitting device, the one of the plurality of first repairing pads is electrically connected to one of the first pads located in the second pixel area, and the one of the first pads is not electrically connected to any of the vertical light emitting devices.

3. The display panel according to claim 1, further comprising:
another flip-chip light emitting device, disposed in the second pixel area and electrically connected to the pixel array substrate, wherein the another flip-chip light emitting device is electrically bonded to another one of the plurality of second pads and one of the plurality of first pads.

4. The display panel according to claim 1, wherein each of the vertical light emitting devices is electrically bonded to the pixel array substrate through a solder pattern, and the solder pattern has a stacked structure of a plurality of metal layers.

5. The display panel according to claim 4, wherein the metal layers comprise a first metal layer, a second metal layer, a third metal layer, and a fourth metal layer sequentially disposed on each of the vertical light emitting devices, a material of the first metal layer comprises titanium, chromium, platinum, or a combination thereof, a material of the second metal layer comprises nickel, copper, palladium, or a combination thereof, a material of the third metal layer comprises gold, silver, copper, palladium, nickel, or a combination thereof, and a material of the fourth metal layer comprises tin, indium, bismuth, tin-bismuth alloy, tin-indium alloy, tin-copper alloy, tin-silver alloy, tin-antimony alloy, tin-zinc alloy, tin-silver-copper alloy, tin-silver-copper-bismuth alloy, or a combination thereof.

6. The display panel according to claim 4, wherein a melting point of one of the metal layers in contact with the pixel array substrate is lower than 260° C.

7. The display panel according to claim 1, wherein the vertical light emitting devices comprise a first vertical light emitting device, a second vertical light emitting device, and a third vertical light emitting device located in the second pixel area, a color of an emitted light beam of one of the first vertical light emitting device, the second vertical light emitting device, and the third vertical light emitting device and the color of the emitted light beam of the flip-chip light emitting device are identical.

8. The display panel according to claim 1, further comprising:
a light absorbing layer, disposed between the vertical light emitting devices and the flip-chip light emitting device, wherein a location of the light absorbing layer relative to the pixel array substrate is lower than locations of the vertical light emitting devices and the flip-chip light emitting device relative to the pixel array substrate.

9. The display panel according to claim 1, further comprising:
an optical film layer, covering the vertical light emitting devices and the flip-chip light emitting device.

10. A display panel, comprising:
a pixel array substrate, having a plurality of pixel areas and a first pad, a second pad, a first repairing pad, and a second repairing pad disposed in each of the pixel areas, wherein the first pad is electrically connected to the first repairing pad through the pixel array substrate, and the second pad and the second repairing pad located in a same one of the pixel areas are electrically connected through the pixel array substrate;
a vertical light emitting device, electrically bonded to the first pad disposed in one of the pixel areas; and
a flip-chip light emitting device, electrically bonded to the first repairing pad and the second repairing pad disposed in the one of the pixel areas, wherein a color of an emitted light beam of the flip-chip light emitting device and a color of an emitted light beam of the vertical light emitting device are identical, the vertical light emitting device is electrically bonded to the first pad, the flip-chip light emitting device is electrically bonded to the first repairing pad and the second repairing pad, the vertical light emitting device is electrically connected to the second pad located in the one of the pixel areas through a conductive line, and the conductive line between the vertical light emitting devices and the second pad has a disconnected part; and a planarization layer, covering the pixel array substrate and a sidewall of the vertical light emitting device and exposing the second pad, the first repairing pad and the second repairing pad, wherein the conductive line extends onto the planarization layer, so as to be electrically connected to the second pad and the vertical light emitting device located in a same one of the pixel areas.

11. The display panel according to claim 10, wherein the vertical light emitting device is electrically bonded to the pixel array substrate through a solder pattern, the solder pattern has a stacked structure of a plurality of metal layers, and a melting point of one of the metal layers in contact with the first pad is lower than 260° C.

12. The display panel according to claim 10, further comprising:
   a light absorbing layer, disposed on peripheries of the vertical light emitting device and the flip-chip light emitting device, wherein a location of the light absorbing layer relative to the pixel array substrate is lower than locations of the vertical light emitting device and the flip-chip light emitting device relative to the pixel array substrate.

13. The display panel according to claim 10, further comprising:
   an optical film layer, covering the vertical light emitting device and the flip-chip light emitting device.

14. The display panel according to claim 10, further comprising:
   another flip-chip light emitting device, wherein the one of pixel areas is provided with another first pad and a second pad, and the another flip-chip light emitting device is electrically connected to the another first pad and the second pad.

* * * * *